(12) United States Patent
Wang et al.

(10) Patent No.: US 11,398,260 B2
(45) Date of Patent: Jul. 26, 2022

(54) NETWORK DEVICE AND NETWORK CONNECTION METHOD WITH LINEAR FEEDBACK SHIFT REGISTER

(71) Applicant: REALTEK SEMICONDUCTOR CORPORATION, Hsinchu (TW)

(72) Inventors: Zhi-Dao Wang, Suzhou (CN); Wei Zhao, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/138,975

(22) Filed: Dec. 31, 2020

(65) Prior Publication Data
US 2021/0217450 A1 Jul. 15, 2021

(30) Foreign Application Priority Data
Jan. 10, 2020 (CN) .......................... 202010025395.6

(51) Int. Cl.
| | |
|---|---|
| G11C 7/10 | (2006.01) |
| G11C 7/22 | (2006.01) |
| H03K 19/17728 | (2020.01) |
| G11C 7/04 | (2006.01) |

(52) U.S. Cl.
CPC .............. *G11C 7/1036* (2013.01); *G11C 7/04* (2013.01); *G11C 7/1051* (2013.01); *G11C 7/222* (2013.01); *H03K 19/17728* (2013.01)

(58) Field of Classification Search
CPC ....... G11C 7/1036; G11C 7/04; G11C 7/1051; G11C 7/222; G11C 19/28; G11C 19/285; H03K 19/17728; H04L 67/141; G06F 7/582
See application file for complete search history.

(56) References Cited

U.S. PATENT DOCUMENTS

| | | | |
|---|---|---|---|
| 6,175,865 B1 | 1/2001 | Dove et al. | |
| 7,383,399 B2* | 6/2008 | Vogt .................... | G06F 12/0804 710/68 |
| 9,686,609 B1* | 6/2017 | O'Connor ................ | H04R 3/12 |

FOREIGN PATENT DOCUMENTS

WO WO-2013163875 A1 * 11/2013 ............... G01B 7/02

\* cited by examiner

*Primary Examiner* — Sultana Begum
(74) *Attorney, Agent, or Firm* — WPAT, PC

(57) ABSTRACT

A network device includes a linear feedback shift register circuit and a value updating circuit. The linear feedback shift register circuit is configured to perform an auto crossover mechanism according to at least one clock signal and a plurality of first bits, in order to control at least one port of a first interface circuit to connect with a second interface circuit. The value updating circuit is configured to perform at least one of a plurality of operations according to exclusive information. The plurality of operations includes: generating a plurality of initial values, in which the value updating circuit is configured to utilize the plurality of initial values to update at least one partial bits of the plurality of first bits; or setting a period of the at least one clock signal, in which the exclusive information includes operational information or production information of the network device.

19 Claims, 6 Drawing Sheets

NETWORK DEVICE AND NETWORK CONNECTION METHOD WITH LINEAR FEEDBACK SHIFT REGISTER

BACKGROUND OF THE INVENTION

1. Field of the Invention

The present disclosure relates to a network device. More particularly, the present disclosure relates to a network device and a network connection method that utilize a random number generator to perform an auto crossover mechanism.

2. Description of Related Art

In certain communication applications, a network device generates a random number to connect with other devices. However, as the random number is generated by predetermined operation(s), this random number could be the same as the random number generated from the other devices, which results in a failure of the connection between two devices. Moreover, if these two devices employ the same circuit design and are products manufactured in the same batch, initial values and operating periods of internal circuits in these two devices are commonly the same with each other. As a result, the chance that the random numbers generated from these two devices are the same is getting higher.

SUMMARY OF THE INVENTION

In some embodiments, a network device includes a linear feedback shift register circuit and a value updating circuit. The linear feedback shift register circuit is configured to perform an auto crossover mechanism according to at least one clock signal and a plurality of first bits, in order to control at least one port of a first interface circuit to connect with a second interface circuit. The value updating circuit is configured to perform at least one of a plurality of operations according to exclusive information. The plurality of operations includes: generating a plurality of initial values, in which the value updating circuit is configured to utilize the plurality of initial values to update at least one partial bits of the plurality of first bits; or setting a period of the at least one clock signal, in which the exclusive information includes operational information or production information of the network device.

In some embodiments, a network connection method includes the following operation: performing at least one of a first operation or a second operation according to exclusive information of a network device, in which the first operation is to generate a plurality of initial values to update at least one bit of a plurality of first bits to be the plurality of initial values, and the second operation is to set a period of at least one clock signal, and the exclusive information includes operational information of the network device or production information of the network device; and performing, by a linear feedback shift register circuit of the network device, an auto crossover mechanism according to the at least one clock signal and the plurality of first bits, in order to control at least one port in a first interface circuit of the network device to connect with a second interface circuit.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuit" may indicate an object, which is formed with one or more transistors and/or one or more active/passive elements based on a specific arrangement, for processing signals. As used herein, the description of "A and/or B" and the description of "at least one of A or B" include any and all combinations of one or more of the associated listed items (i.e., A, B). For example, the description of "A and/or B" and the description of "at least one of A or B" may indicate A, B, or a combination of A and B.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

For ease of understanding, like elements in various figures are designated with the same reference number.

Figure 1A:
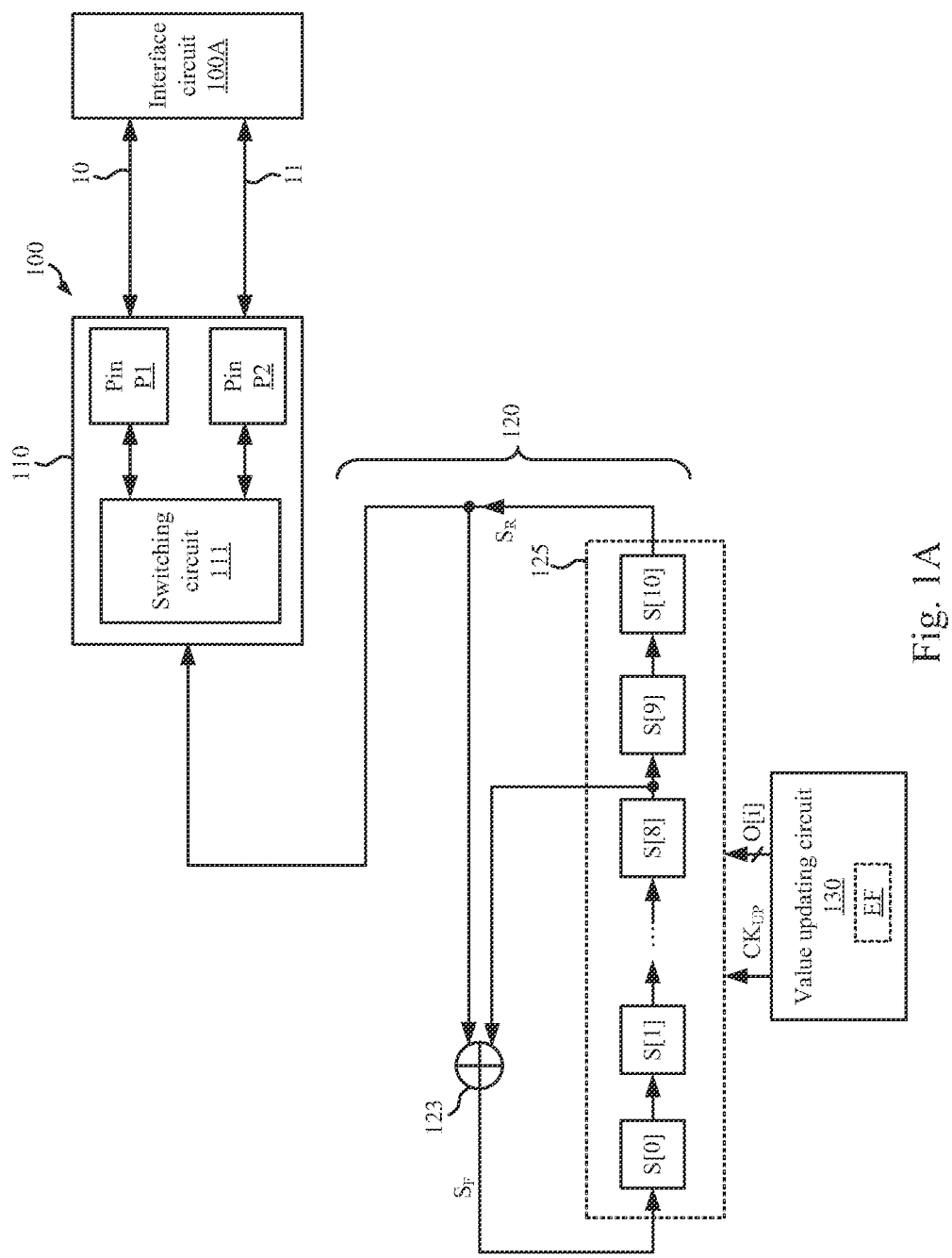
FIG. 1A is a schematic diagram of a network device according to some embodiments of the present disclosure.

FIG. 1A is a schematic diagram of a network device 100 according to some embodiments of the present disclosure. In some embodiments, the network device 100 may be (but not limited to) a network card, a modem, a switch, a repeater, or the like.

The network device 100 includes an interface circuit 110, a linear feedback shift register (LFSR) circuit 120, and a value updating circuit 130. The interface circuit 110 is a media dependent interface (MDI) interface circuit. The interface circuit 110 includes a pin P1, a pin P2, and a switching circuit 111. The pin P1 is coupled to an interface circuit 100A of another device via a cable 10, the pin P2 is coupled to the interface circuit 100A via a cable 11. In some embodiments, the cable 10 and the cable 11 is a twisted pair. The switching circuit 111 sets one of the pins P1 and P2 to receive data according to a pseudo random value $S_R$, and sets another one of the pins P1 and P2 to transmit data. For example, the pin P1 is set to be coupled to a receiver (not shown) of the network device 100, in order to receive data from the interface circuit 100A. The pin P2 is set to be coupled to a transmitter (not shown) of the network device 100, in order to output data to the interface circuit 100A.

The LFSR circuit 120 performs an auto crossover mechanism (also referred to as automatic MDI/MDI-X) defined in a predetermined communication protocol (e.g., IEEE 802.3) according to a clock signal $CK_{UP}$ and bits S[0]-S[9], in order to generate the pseudo random value $S_R$. The pseudo random value $S_R$ may be utilized as a control signal of the auto crossover mechanism. The LFSR circuit 120 includes an exclusive OR (XOR) gate circuit 123 and a shift register circuit 125. The clock signal $CK_{UP}$ of the LFSR circuit 120 may be RND (sample_timer) defined in the specification of IEEE 802.3. Operations utilizing the pseudo random value $S_R$ to perform the auto crossover mechanism can be understood with reference to the specification of the above communication protocol, and thus the repetitious descriptions are not given.

The XOR gate circuit 123 and the shift register circuit 125 operate as a pseudo random number generator, in order to generate the pseudo random value $S_R$. In this embodiment, the shift register circuit 125 stores the bits S[0]-S[10]. In response to a shift signal $S_F$ and the clock signal $CK_{UP}$, the shift register circuit 125 sequentially updates the eleven bits S[0]-S[10], and outputs the previous eleventh bit S[10] as the pseudo random value $S_R$. For example, in response to a transition edge of the clock signal $CK_{UP}$, the shift register circuit 125 updates the bit S[0] to be the shift signal $S_F$, and updates the bit S[1] to be the previous bit S[0]. With this analogy, the shift register circuit 125 is able to output the previous eleventh bit S[10] as the pseudo random value $S_R$. The XOR gate circuit 123 generates the shift signal $S_F$ according to the bit S[8] and the pseudo random value $S_R$. The arrangement of the XOR gate circuit 123 and the shift register circuit 125 is not limited to FIG. 1.

In some embodiments, the value updating circuit 130 performs at least one of the following operations according to exclusive information EF. A first operation is to generate initial values O[i] of the LFSR circuit 120, in order to utilize the initial values O[i] to update partial bits or all bits of the bits S[0]~S[10] stored in the shift register circuit 125. For example, when the network device 100 boots up, the value updating circuit 130 updates the partial bits S[0]~S[9] to be the initial values O[i]. A second operation is to set a period of the clock signal $CK_{UP}$ of the LFSR circuit 120. In other words, according to the exclusive information EF, the value updating circuit 130 is able to perform one of the first operation and the second operation, or to perform both of the first operation and the second operation.

In some embodiments, the exclusive information EF is associated with operational information about the network device 100 (e.g., temperature, clock rate, voltage, etc.). In some embodiments, the exclusive information EF is production information (e.g., wafer coordinate information or the like) of the network device 100.

In some related approaches, if mass-produced network devices employ the same circuit design, initial values and updating periods generated from the pseudo random number generators in these network devices may be the same. As a result, these network devices may have a chance to generate the same pseudo random value, and thus results in a failure of the auto crossover mechanism. As a result, these devices cannot connect to each other properly. Compared with the above approaches, in some embodiments of the present disclosure, the value updating circuit 130 sets the initial values of the bits stored in the shift register circuit 125 and the updating period according to the exclusive information EF owned by the network device 100. As a result, the chance to generate the same pseudo random values by two devices having the same circuit design can be lower.

Figure 1B:
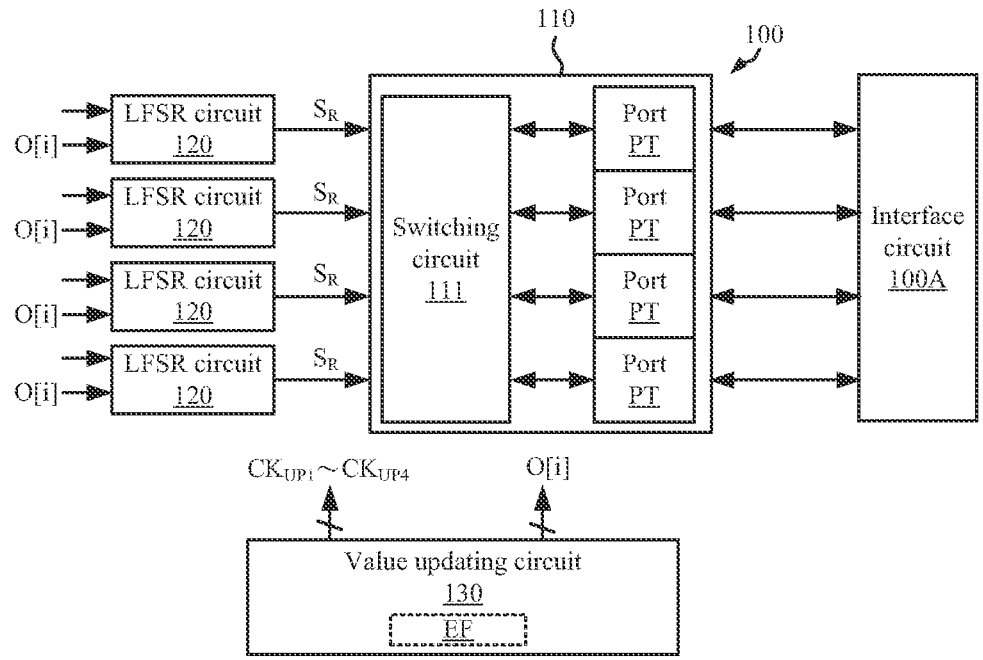
FIG. 1B is a schematic diagram of the network device according to some embodiments of the present disclosure.

FIG. 1B is a schematic diagram of the network device 100 according to some embodiments of the present disclosure. Compared with FIG. 1A, in this example, the interface circuit 110 includes ports PT and LFSR circuits 120. Each of the ports PT may include the pin P1 and the pin P2 in FIG. 1A. Each of the LFSR circuits 120 controls one of the ports PT according to a corresponding one of the clock signal $CK_{UP1}$-$CK_{UP4}$. The value updating circuit 130 provides the initial values O[i] to the LFSR circuits 120, and outputs the clock signal $CK_{UP1}$-$CK_{UP4}$ having different periods.

Figure 2:
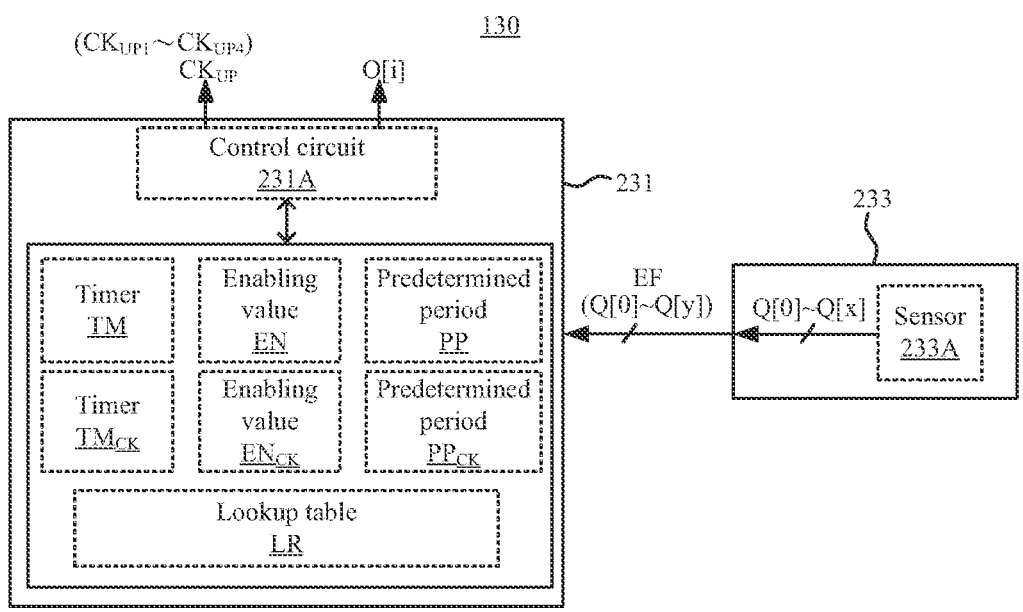
FIG. 2 is a schematic diagram of the value updating circuit in FIG. 1A or FIG. 1B according to some embodiments of the present disclosure.

FIG. 2 is a schematic diagram of the value updating circuit 130 in FIG. 1A or FIG. 1B according to some embodiments of the present disclosure. The value updating circuit 130 includes a processing logic circuit 231 and an on-chip sensor circuit 233.

Figure 5:
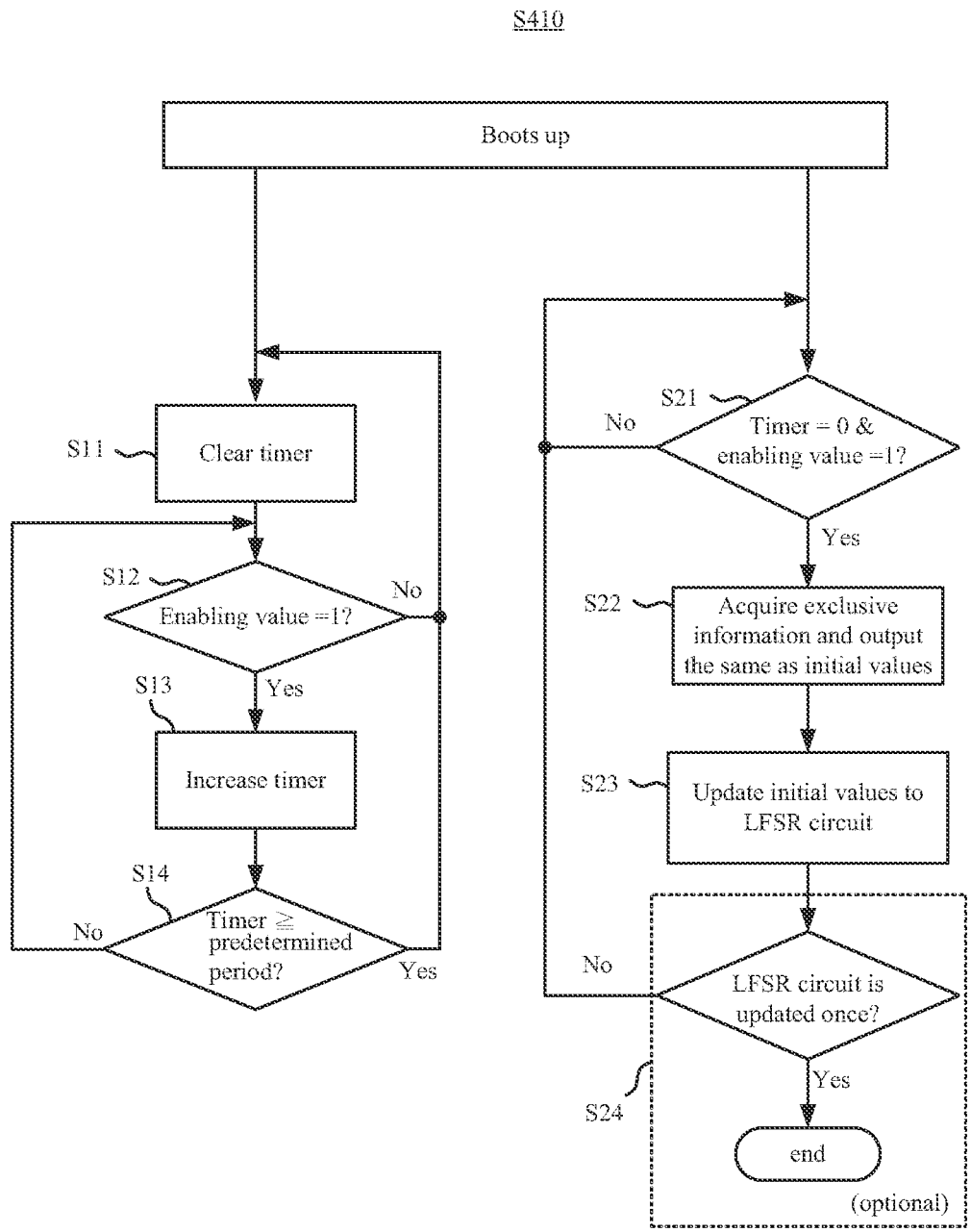
FIG. 5 is a flow chart of one operation in FIG. 4 according to some embodiments of the present disclosure.

As described in FIG. 5, in response to a timer TM, an enabling value EN, and a predetermined period PP, the processing logic circuit 231 generates the initial values O[i] according to the exclusive information EF. As described in FIG. 6, in response to a timer $TM_{CK}$, an enabling value $EN_{CK}$, a predetermined period $PP_{CK}$, the processing logic circuit 231 reads a lookup table LR, in order to set the period of the clock signal $CK_{UP}$.

The processing logic circuit 231 includes a control circuit 231A and at least one register. The at least one register stores the timer TM, the timer $TM_{CK}$, the enabling values EN and $EN_{CK}$, the predetermined periods PP and $PP_{CK}$, and the lookup table LR. The control circuit 231A performs operations in FIGS. 4-6, in order to output the initial values O[i] according to the exclusive information EF and/or to set the period of the clock signal $CK_{UP}$ according to the exclusive information EF. In some embodiments, the control circuit 231A may be a state machine that performs operations in FIGS. 4-6, in which the state machine may be implemented with one or more logic circuits.

The on-chip sensor circuit 233 is configured to detect circuit operating conditions of the network device 100, in order to generate bits Q[0]-Q[X]. For example, the on-chip sensor circuit 233 includes a sensor 233A, which may be a temperature sensor circuit (or a clock rate sensor circuit), in order to detect a current operating temperature (or a current clock rate) of any circuit in the network device 100 and to generate the bits Q[0]-Q[x] accordingly. The control circuit 231A acquires and utilizes at least one part of the bits Q[0]-Q[x] (which may be, for example, bits Q[0]-Q[y], in which x and y are positive integers, and y is equal to or smaller than x) as the exclusive information EF.

In some embodiments, the at least one part of the bits Q[0]-Q[y] may be low weighted bits (e.g., LSB) of the bits Q[0]-Q[x], which provides finer resolution. For example, the sensor 233A is a temperature sensor circuit that generates 22-bit data (i.e., x=21) to indicate the operating temperature of the network device 100. In this case, the exclusive information EF may be low 10-bit (i.e., bits Q[0]-Q[9], and y is 9) of the 22-bit data. The low 10-bit is able to provide a resolution smaller than about 0.0625° C. Because of the variation of the practical environment and/or impacts from noises, the operating temperature of the network device 100 varies randomly. Therefore, the low weighted bits Q[0]-Q[9] having the sufficient resolution can be considered as special information (i.e., the exclusive information EF) of the network device 100. The control circuit 231A outputs the low weighted bits Q[0]-Q[9] as the initial values O[i], in order to update the bits S[0]-S[9] of the shift register circuit 125 in FIG. 1A or FIG. 1B to be the initial values O[i] respectively.

Figure 3:
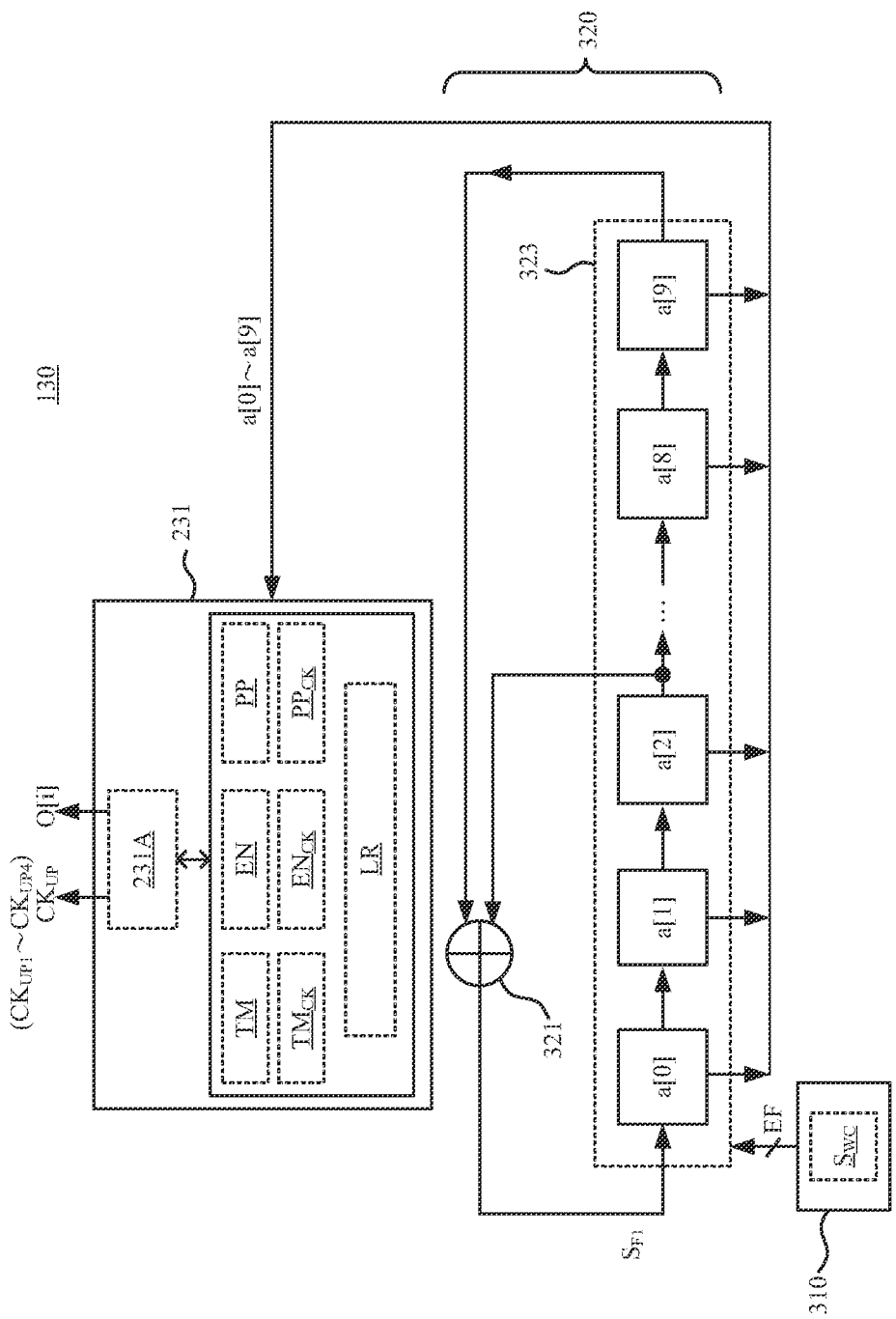
FIG. 3 is a schematic diagram of the value updating circuit in FIG. 1A or FIG. 1B according to some embodiments of the present disclosure.

FIG. 3 is a schematic diagram of the value updating circuit 130 in FIG. 1A or FIG. 1B according to some embodiments of the present disclosure. In this example, the value updating circuit 130 includes the processing logic circuit 231, a memory circuit 310, and a pseudo random generator circuit 320. Operations of the processing logic circuit 231 are similar to those in FIG. 2, and thus the repetitious descriptions are not given. The memory circuit 310 may be a one-time programmable (OTP) memory, an E-fuse, or the like, and stores the wafer coordinate information $S_{WC}$. The wafer coordinate information $S_{WC}$ indicates a location of the network device 100 on a wafer during a production progress.

For example, in the course of producing the network device 100 (or the value updating circuit 130), a manufacturer may store a location of a chip that includes the network device 100 (or the value updating circuit 130) on a wafer to the memory circuit 310. If each of a coordinate of X-axis and that of Y-axis about the location on the wafer can be, for example but not limited to, expressed by 8-bit data, 5 low bits in the 8-bit data corresponding to the X-axis and 5 low bits in the 8-bit data corresponding to the Y-axis can be combined as 10-bit data (i.e., the wafer coordinate information $S_{WC}$), and the wafer coordinate information $S_{WC}$ is stored to the memory circuit 310. The memory circuit 310 is able to output the wafer coordinate information $S_{WC}$ as the exclusive information EF.

The pseudo random generator circuit 320 generates bits a[0]-a[9] according to the exclusive information EF, and sequentially outputs the bits a[0]-a[9] to the processing logic circuit 231 according to a predetermined updating period. The pseudo random generator circuit 320 includes an XOR gate circuit 321 and a shift register circuit 323. The shift register circuit 323 stores the 10 bits a[0]-a[9], in which the initial values of the bits a[0]-a[9] are set according to the exclusive information EF (for example, the initial values of the bits a[0]-a[9] are set to be the 10-bit wafer coordinate information $S_{EC}$). In response to a shift signal $S_{F1}$, the shift register circuit 323 sequentially updates the 10 bits a[0]-a[9]. The XOR gate circuit 321 generates the shift signal $S_{F1}$ according to one of the bits a[0]-a[9] (e.g., the bit a[2]) and the previous bit a[9]. The control circuit 231A outputs the bits a[0]-a[9] as the initial values O[i], and sets the period of the clock signal $CK_{UP}$ accordingly.

In this example, when massively producing the network devices 100 (or the value updating circuit 130), the network devices 100 (or the value updating circuit 130) are located at different locations on the same wafer. By using the LSFR 320 to generate (pseudo) random bits a[0]-a[9] according to the exclusive information EF, the uniqueness of the initial values O[i] and the clock signal $CK_{UP}$ can be further increased.

Figure 4:
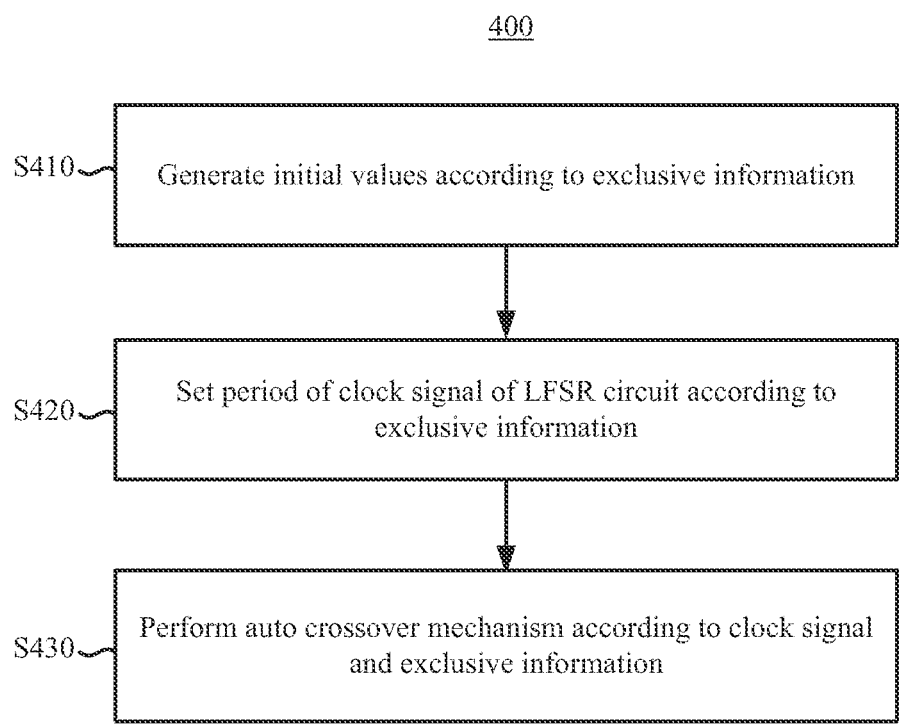
FIG. 4 is a flow chart of a network connection method according to some embodiments of the present disclosure.

FIG. 4 is a flow chart of a network connection method 400 according to some embodiments of the present disclosure. In some embodiments, the network device 400 may be performed by circuits shown in the figures discussed above.

In operation S410, initial values are generated according to exclusive information. In operation S420, a period of a clock signal of a LFSR circuit is set according to the exclusive information. In operation S430, an auto crossover mechanism is performed according to the clock signal and the exclusive information.

Operation S410 is described with reference to FIG. 5. FIG. 5 is a flow chart of operation S410 in FIG. 4 according to some embodiments of the present disclosure. In step S11, after the network device 100 boots up, the control circuit 231A clears the timer TM, in order to reset the timer TM to be a starting value (e.g., 0). In step S12, the control circuit 231A determines whether the enabling value EN is a predetermined logic value (e.g., logic value of 1). In step S13, if the enabling value EN is the logic value of 1, the control circuit 231A starts increasing the timer TM. In step S14, the control circuit 231A determines whether the timer TM is higher than or equal to the predetermined period PP. When the timer TM is higher than or equal to the predetermined period PP, or when the enabling value EN is not the predetermined logic value, the control circuit 231A performs step S11 again. If the timer TM is still less than the predetermined period PP, the control circuit 231A performs step S12 again.

In step S21, after the network device 100 boots up, the control circuit 231A determines whether the timer TM is the starting value and whether the enabling value EN is the predetermined logic value. With steps S11-S14 and step S21, the control circuit 231A determines an operating interval for generating the initial value O[i]. In step S22, if the timer TM is the starting value and the enabling value EN is the predetermined logic value, the control circuit 231A acquires the exclusive information from the on-chip sensor circuit 233 or the memory circuit 310, in order to start generating the initial values O[i] according to the exclusive information EF. If the timer TM is not the starting value or if the enabling value EN is not the predetermined logic value, the control circuit 231A performs step S21 again. In step S23, the value updating circuit 130 stores the initial values O[i] to the LFSR circuit 120, in order to update the partial bits S[0]-S[9] of the shift register circuit 125.

In some optional embodiments, operation S410 may further include step S24. In step S24, the control circuit 231A determines whether the LFSR circuit 120 is updated once. If the LFSR circuit 120 is updated once, no new initial values O[i] will be generated; otherwise, step S21 is performed again.

Figure 6:
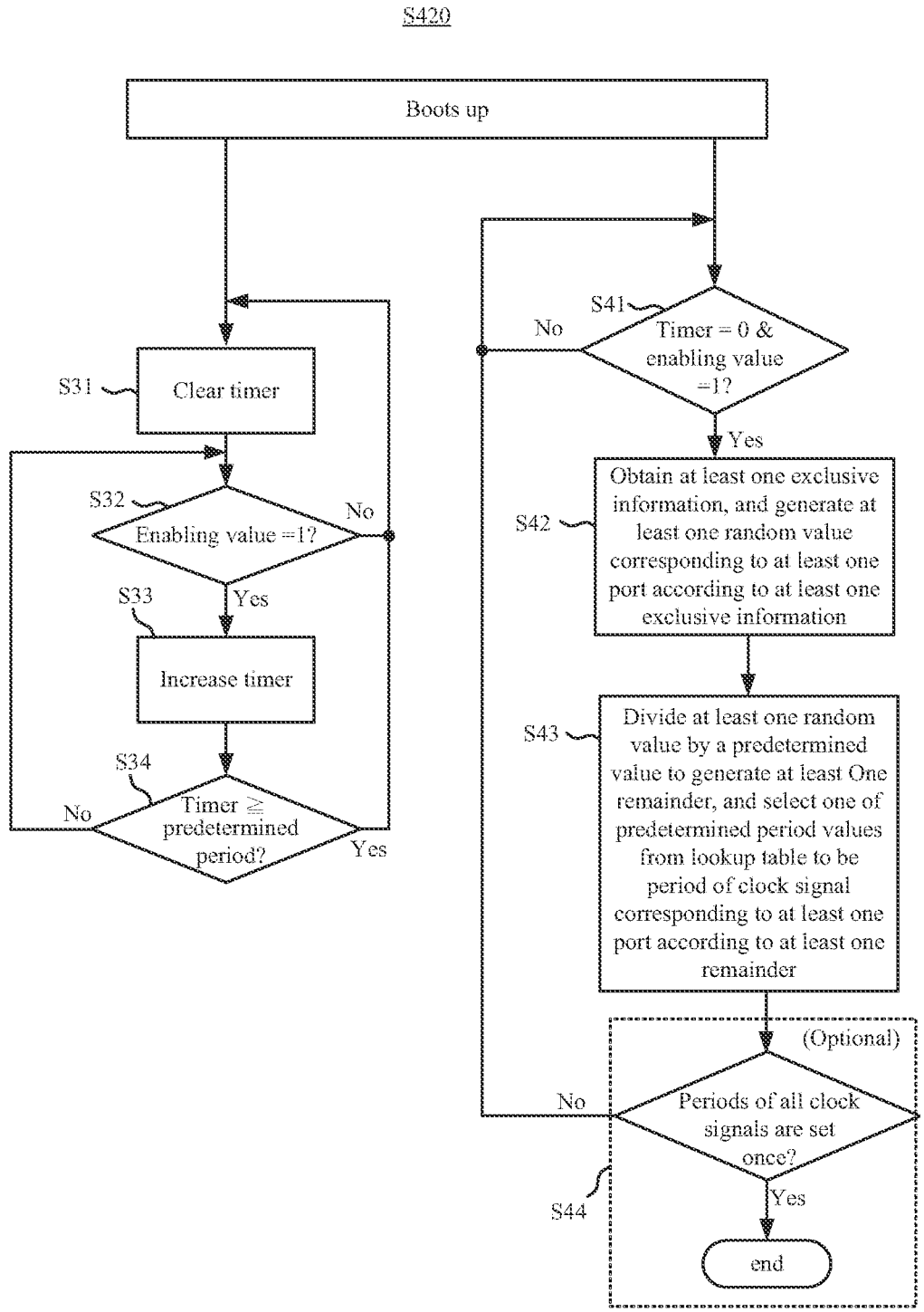
FIG. 6 is a flow chart of another one operation in FIG. 4 according to some embodiments of the present disclosure.

Operation S420 is described with reference to FIG. 6. FIG. 6 is a flow chart of operation S420 in FIG. 4 according to some embodiments of the present disclosure. In step 31, after the network device 100 boots up, the control circuit 231A clears the timer $TM_{CK}$, in order to reset the timer $TM_{CK}$ to the starting value (e.g., 0). In step S32, the control circuit 231A determines whether the enable value $EN_{CK}$ is a predetermined logic value (e.g., a logic value of 1). In step S33, if the enable value $EN_{CK}$ is the predetermined logic value, the control circuit 231A starts increasing the timer $TM_{CK}$ (i.e., step S33). In step S34, the control circuit 231A determines whether the timer $TM_{CK}$ is greater than or equal to the predetermined period $PP_{CK}$. When the timer $TM_{CK}$ is greater than or equal to the predetermined period $PP_{CK}$, or when the enable value $EN_{CK}$ is not the predetermined logic value, the control circuit 231A performs step S31 again. When the timer $TM_{CK}$ is less than the predetermined period PP, the control circuit 231A performs step S32 again.

In step S41, after the network device 100 boots up, the control circuit 231A determines whether the timer $TM_{CK}$ is the starting value and whether the enable value $EN_{CK}$ is the predetermined logic value. With steps S31-S34 and S41, the control circuit 231A determines an operating interval for setting the clock signal $CK_{UP}$. In step S42, if the timer $TM_{CK}$ is the starting value and the enable value $EN_{CK}$ is the predetermined logic value, the control circuit 231A acquires at least one exclusive information EF from the on-chip sensor circuit 233 or the memory circuit 310, and starts generating at least one random value corresponding to at least one port according to the exclusive information EF (i.e., step S42). If the timer $TM_{CK}$ is not the starting value or if the enable value $EN_{CK}$ is not the predetermined logic value, the control circuit 231A performs step S41 again. In step S43, the value updating circuit 130 divides the at least one random value m by a predetermined value N to generate at least one remainder n, and select a corresponding one of predetermined period values from the lookup table LR according to the at least one remainder n, in order to set the selected predetermined period to be the period of the clock signal $CK_{UP}$ of the corresponding at least one port.

For example, the lookup table LR stores different predetermined period values, in which the number of the predetermined period values (i.e., the predetermined value N) is set according to requirements of the auto crossover mechanism. For example, the predetermined value N may be less than or equal to 32. In the example of FIG. 1A, the control circuit 231A may utilize partial bits (e.g., 5 bits) of the exclusive information EF to be the random value m corresponding to one port (i.e., the pins P1 and P2). For example, if the 5 bits are 01001, the random value m is 9. The control circuit 231A divides 9 by 32 to generate the remainder as 9 (i.e., the remainder n), selects a period value having an index value of 9 from the lookup table LR, and set this period value as the period of the clock signal $CK_{UP}$.

Alternatively, in the example of FIG. 1B, the control circuit 231A reads the exclusive information EF twice, in order to acquire data having 20 bits. The control circuit 231A divides the 20-bit data into four 5-bit data, and outputs the four 5-bit as 4 random values m respectively corresponding to the four ports PT. The control circuit 231A divides the first random value m by the predetermined value N to acquire a first remainder n, and selects a corresponding predetermined period value from the lookup table LR according to the first remainder n, in order to set the selected predetermined period value to be the period of the clock signal $CK_{UP1}$. Afterwards, the control circuit 231A deletes the selected predetermined period value in the lookup table LR, in order to update the predetermined value N. As one predetermined period value of the predetermined period values is deleted, the number of the predetermined period values is updated to be N−1 (i.e., N=N−1). After the predetermined period values are updated (i.e., N=N−1), the control circuit 231A generates a second remainder according to the second random value and the current predetermined value N, in order to set the period of the second clock signal $CK_{UP2}$. With this analogy, the control circuit 231A is able to set the periods of the clock signal $CK_{UP1}$-$CK_{UP4}$ to be different from each other.

For example, the first 5-bit data is 01001, and thus the first random value m is 9. The second 5-bit data is 00001, and thus the second random value m is 1. With this analogy, fourth random values m can be obtained. The control circuit 231A divides 9 by 32 to obtain that the remainder is 9, and selects the period value having the index value of 9 from the lookup table LR according to this remainder, in order to set the selected period value to be the period of the first clock signal $CK_{UP1}$. Then, the control circuit 231A deletes the period value having the index value of 9 in the lookup table LR, and thus the predetermined value is changed from 32 to 31. Afterwards, the control circuit 231A divides 1 by 31 to obtain that the remainder is 1, and selects the period value having the index value of 1 from the lookup table LR according to this remainder, in order to set the selected period value to be the period of the second clock signal $CK_{UP2}$. With this analogy, the control circuit 231A is able to set the clock signals $CK_{UP1}$-$CK_{UP4}$ having different periods.

In some optional embodiments, operation S420 may further include step S44. In step S44, the control circuit 231A determines whether the period of the clock signal $CK_{UP}$ is set once. If the periods of all clock signal $CK_{UP}$ are set once, the periods of the clocks $CK_{UP}$ will not be set again; otherwise, step S41 is performed again.

The above description of the network connection method 400 includes exemplary operations, but the operations of the network connection method 400 are not necessarily performed in the order described above. Operations of the network connection method 400 can be added, replaced, changed order, and/or eliminated, or the operations can be executed simultaneously or partially simultaneously as appropriate, in accordance with the spirit and scope of various embodiments of the present disclosure. For example, in some embodiments, the network connection method 400 may perform operation S410 and operation S430 without performing operation S420. In some other embodiments, the network connection method 400 may perform operation S420 and operation S430 without performing operation S410.

The values described in the above embodiments (e.g., the number of bits/pins/ports, the starting value, the predetermined logic value, the temperature, etc) are given for illustrative purposes, and the present disclosure is not limited to thereto.

As described above, the network device and the network connection method provided in some embodiments of the present disclosure are able to utilize unique information of the device to generate the pseudo random value and the updating period of the auto crossover mechanism. As a result, it is able to improve the chance to prevent two devices having the same circuit design from being unable to connect with each other due to the same initial value and/or the same updating period.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A network device, comprising:
a linear feedback shift register circuit configured to perform an auto crossover mechanism according to at least one clock signal and a plurality of first bits, in order to control at least one port of a first interface circuit to connect with a second interface circuit; and
a value updating circuit configured to perform at least one of a plurality of operations according to exclusive information, wherein the plurality of operations comprises:
generating a plurality of initial values, wherein the value updating circuit is configured to utilize the plurality of initial values to update at least one partial bits of the plurality of first bits; or
setting a period of the at least one clock signal, wherein the exclusive information comprises operational information or production information of the network device, and the operational information indicates an operating temperature of the network device or a clock rate of the network device.

2. The network device of claim 1, wherein the value updating circuit comprises:
a processing logic circuit configured to generate the plurality of initial values according to the exclusive information in response to a first enabling value and a first timer.

3. The network device of claim 2, wherein when the first timer is a starting value and the first enabling value is a predetermined logic value, the processing logic circuit is configured to output the exclusive information as the plurality of initial values.

4. The network device of claim 1, wherein the value updating circuit comprises:
a processing logic circuit configured to read a lookup table to select a corresponding predetermined period value from a plurality of predetermined period values in response to a second enabling value and a second timer, in order to set the period of the at least one clock to be the corresponding predetermined period value.

5. The network device of claim 4, wherein when the second timer is a staring value and the second enabling value is a predetermined logic value, the processing logic circuit is configured to set the period of the at least one clock signal according to the exclusive information.

6. The network device of claim 4, wherein the processing logic circuit is configured to generate at least one random value corresponding to the at least one port according to the exclusive information, and to divide the at least one random value by a first value to generate at least one remainder, in order to select the corresponding predetermined period value, and the first value is a number of the plurality of predetermined period values.

7. The network device of claim 1, wherein the value updating circuit comprises:
an on-chip sensor circuit configured to generate a plurality of second bits according to the operational information, wherein at least one part of the plurality of second bits is the exclusive information.

8. The network device of claim 7, wherein the at least one part of the plurality of second bits is a low weighted bit.

9. The network device of claim 1, wherein the value updating circuit comprises:
a memory circuit configured to store the production information, in order to output the production information as the exclusive information; and
a pseudo random number generator circuit configured to generate a plurality of bits according to the exclusive information, wherein the plurality of bits are outputted as the plurality of initial values or are outputted to set the period of the at least one clock signal.

10. A network connection method, comprising:
performing at least one of a first operation or a second operation according to exclusive information of a network device, wherein the first operation is to generate a plurality of initial values to update at least one bit of a plurality of first bits to be the plurality of initial values, and the second operation is to set a period of at least one clock signal, and the exclusive information comprises operational information of the network device or production information of the network device, and the operational information indicates an operating temperature of the network device or a clock rate of the network device; and
performing, by a linear feedback shift register circuit of the network device, an auto crossover mechanism according to the at least one clock signal and the plurality of first bits, in order to control at least one port in a first interface circuit of the network device to connect with a second interface circuit.

11. The network connection method of claim 10, wherein the first operation comprises:
in response to a first enabling value and a first timer, generating the plurality of initial values according to the exclusive information.

12. The network connection method of claim 11, wherein generating the plurality of initial values according to the exclusive information comprises:
when the first timer is a starting value and the first enabling value is a predetermined logic value, outputting the exclusive information as the plurality of initial values.

13. The network connection method of claim 11, wherein generating the plurality of initial values according to the exclusive information comprises:
detecting, by an on-chip sensor circuit, the operational information, in order to generate a plurality of second bits, wherein at least one part of the plurality of second bits is the exclusive information.

14. The network connection method of claim 13, wherein the at least one part of the plurality of second bits is a low weighted bit.

15. The network connection method of claim 11, wherein generating the plurality of initial values according to the exclusive information comprises:
storing, by a memory circuit, the production information, in order to output the production information as the exclusive information; and
generating, by a pseudo random value generator circuit, a plurality of bits, wherein the plurality of bits are outputted as the plurality of initial values or are outputted to set the period of the at least one clock signal.

16. The network connection method of claim 10, wherein the second operation comprises:
in response to a second enabling value and a second timer, reading a lookup table according to the exclusive information to select a corresponding predetermined period value from a plurality of predetermined period values to be the period of the at least one clock signal.

17. The network connection method of claim 16, wherein reading the lookup table according to the exclusive information comprises:
   generating at least one random value corresponding to the at least one port according to the exclusive information;
   dividing the at least one random value by a first value to generate at least one remainder; and
   selecting the corresponding predetermined period value according to the at least one remainder, wherein the first value is a number of the plurality of predetermined period value.

18. The network connection method of claim 10, wherein the production information is wafer coordinate information.

19. A network device, comprising:
   a linear feedback shift register circuit configured to perform an auto crossover mechanism according to at least one clock signal and a plurality of first bits, in order to control at least one port of a first interface circuit to connect with a second interface circuit; and
   a value updating circuit configured to perform at least one of a plurality of operations according to exclusive information, wherein the plurality of operations comprises:
      generating a plurality of initial values, wherein the value updating circuit is configured to utilize the plurality of initial values to update at least one partial bits of the plurality of first bits; or
      setting a period of the at least one clock signal, wherein the exclusive information comprises wafer coordinate information of the network device.

* * * * *